(12) United States Patent
Lee et al.

(10) Patent No.: US 9,810,814 B2
(45) Date of Patent: Nov. 7, 2017

(54) DISPLAY DEVICE

(71) Applicant: LG DISPLAY CO., LTD., Seoul (KR)

(72) Inventors: Gyu Ho Lee, Seoul (KR); Won Bong Jang, Seoul (KR); Nam Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 199 days.

(21) Appl. No.: 14/582,739

(22) Filed: Dec. 24, 2014

(65) Prior Publication Data

US 2015/0378061 A1 Dec. 31, 2015

(30) Foreign Application Priority Data

Jun. 30, 2014 (KR) .................. 10-2014-0080484
Nov. 5, 2014 (KR) .................. 10-2014-0152941

(51) Int. Cl.
| | | |
|---|---|---|
| G06F 3/044 | (2006.01) | |
| G02B 1/14 | (2015.01) | |
| G02B 1/04 | (2006.01) | |
| G02F 1/1333 | (2006.01) | |
| G06F 3/041 | (2006.01) | |
| H01L 27/32 | (2006.01) | |
| H01L 51/00 | (2006.01) | |
| H01L 51/52 | (2006.01) | |
| G02B 5/20 | (2006.01) | |

(52) U.S. Cl.
CPC .............. *G02B 1/14* (2015.01); *G02B 1/04* (2013.01); *G02B 5/201* (2013.01); *G02F 1/133308* (2013.01); *G06F 3/044* (2013.01); *G06F 3/0412* (2013.01); *H01L 27/323* (2013.01); *H01L 51/004* (2013.01); *H01L 51/5237* (2013.01); *H01L 51/5253* (2013.01); *G02F 2001/133331* (2013.01); *G06F 2203/04102* (2013.01); *H01L 2251/5338* (2013.01)

(58) Field of Classification Search
CPC ........... G02B 1/04; G02B 1/14; G06F 3/0412; G06F 3/044; G06F 2203/04102; H01L 51/5237; H01L 51/5253; H01L 51/004
USPC .................................... 345/173–174
See application file for complete search history.

(56) References Cited

U.S. PATENT DOCUMENTS

| | | | |
|---|---|---|---|
| 5,118,570 A | 6/1992 | Malhotra | |
| 2002/0101409 A1* | 8/2002 | Yokoyama | C03C 27/10 345/173 |
| 2003/0215582 A1* | 11/2003 | Bermel | B29C 41/12 428/1.31 |
| 2006/0183858 A1* | 8/2006 | Takesada | C08L 33/08 525/100 |
| 2007/0248799 A1* | 10/2007 | DeAngelis | G01L 1/146 428/209 |

(Continued)

FOREIGN PATENT DOCUMENTS

| | | |
|---|---|---|
| CN | 101231538 A | 7/2008 |
| DE | 102014202507 A1 | 9/2014 |

(Continued)

*Primary Examiner* — Sophie Hon
(74) *Attorney, Agent, or Firm* — Birch, Stewart, Kolasch & Birch, LLP (57) ABSTRACT

A display device can include: a display panel configured to include a first substrate and a second substrate, and a cover substrate disposed on the display panel and configured to contain a carbonate compound.

15 Claims, 3 Drawing Sheets

(56) References Cited

U.S. PATENT DOCUMENTS

| | | | | |
|---|---|---|---|---|
| 2009/0315456 A1* | 12/2009 | Furukawa | ............ | H01L 27/326 313/504 |
| 2012/0127117 A1* | 5/2012 | Ku | ......................... | G06F 3/044 345/174 |
| 2014/0267141 A1* | 9/2014 | Yilmaz | ................... | G06F 3/044 345/174 |
| 2015/0138452 A1* | 5/2015 | Petcavich | ............. | G06F 3/0412 349/12 |

FOREIGN PATENT DOCUMENTS

| | | | | |
|---|---|---|---|---|
| EP | 0234819 A2 | 9/1987 | | |
| EP | 2806473 A1 | 11/2014 | | |
| JP | EP 0942351 A4 * | 9/1999 | ........... | C03C 17/009 |
| WO | WO 2012/160894 A1 | 11/2012 | | |
| WO | WO 2015/076858 A1 | 5/2015 | | |

* cited by examiner

DISPLAY DEVICE

The present application claims priority under 35 U.S.C. §119(a) of Korean Patent Application Nos. 10-2014-0080484 filed on Jun. 30, 2014 and 10-2014-0152941 filed on Nov. 5, 2014, which are hereby incorporated by reference in its entirety.

BACKGROUND OF THE INVENTION

Field of the Disclosure

The present application relates to a display device, and more particularly to a display device adapted to enhance flexibility and touch sensitivity.

Description of the Related Art

Nowadays, a display field for visually representing an electrical information signal has been rapidly developed with the spread of information society. In accordance therewith, a variety of flat panel display devices with features, such as slimness, light weight and low power consumption have been developed. Also, the flat panel display devices have been rapidly replacing the existing cathode ray tubes (CRTs).

As examples of the flat panel display devices, liquid crystal display (LCD) devices, organic light emitting display (OLED) devices, electrophoretic display (electric paper display (EPD)) devices, plasma display panel (PDP) devices, field emission display (FED) devices, electroluminescence display devices (ELDs), elector-wetting display (EWD) devices, and so on can be introduced.

Also, as the display devices are actively developed, it requires that the display devices have diversity distinguished from the existing designs, enhance esthethic values, and provide useful multi-functions to use. In accordance therewith, a flexible display device using a flexible material such as a plastic material and so on is developed. The flexible display device can be designed in a variety of shapes, unlike the flat panel display device of the related art.

A cover substrate can be applied to a screen of the display device. The cover substrate can be used to protect the display device. As such, it is necessary for the cover substrate to secure high hardness and high impact resistance. Also, the cover substrate can be applied to a flexible display device. To this end, the cover substrate must secure flexibility.

As a cover substrate of the related art, a tempered glass is being mainly used. The tempered glass has poor molding characteristics. Due to this, it is difficult for the tempered glass to apply to the flexible display device.

To address this matter, a cover substrate formed from a plastic material with superior molding characteristics is being actively researched. However, the plastic material has a lower surface strength compared to a glass material. As such, the plastic cover substrate has a poor scratch-resistance characteristic and is easily deformed under high temperature and humidity circumstances. Due to this, the plastic cover substrate must deteriorate reliability of the display device.

Also, a touch panel is being applied to a display device. The touch panel can input data by touching an input device, such as a finger, a stylus or others, and images are displayed on the display device. Such a touch panel can be largely classified into an electrostatic capacity type and a resistant film type.

The resistant film type touch panel senses a variation of the resistance and detects a touch position. The electrostatic capacity type touch panel senses a variation of the capacitance between electrodes and detects a touch position when it is touched by a finger. The resistant film type touch panel can cause deterioration of performance and scratches by being repeatedly used. Due to this, the electrostatic capacity type touch panel with superior durability and long lifespan becomes the center of public interest.

In order to smoothly drive such a touch panel applied to the display device, a thick cover substrate is preferable to have a high dielectric constant. In most cases, the plastic materials have lower dielectric constants compared to the tempered glass materials. Due to this, a cover substrate formed from a plastic material must deteriorate touch sensitivity of the touch panel which is applied to the display device.

In view of these points, it is necessary to develop a cover substrate which has superior surface hardness and flexibility (or moldability) and maintains superior reliability under high temperature and humidity circumferences without deteriorating any touch sensitivity.

BRIEF SUMMARY OF THE INVENTION

Accordingly, embodiments of the present invention are directed to a display device that substantially obviates one or more of problems due to the limitations and disadvantages of the related art.

The embodiments are to provide a display device with a cover substrate which has superior flexibility and surface hardness and maintains superior durability under high temperature and humidity circumstances.

Also, the embodiments are to provide a display device which is adapted to enhance touch sensitivity by employing a cover substrate with an enhanced dielectric constant.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment, a display device includes: a display panel configured to include a first substrate and a second substrate; and a cover substrate disposed on the display panel and configured to contain a carbonate compound.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Reference will now be made in detail to embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 1:
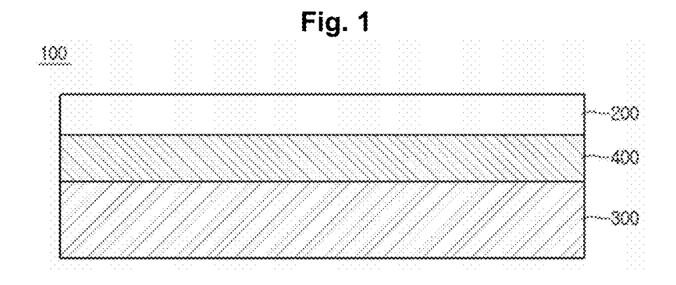
FIG. 1 is a cross-sectional view showing a display device according to an embodiment of the present invention.
Figure 2:
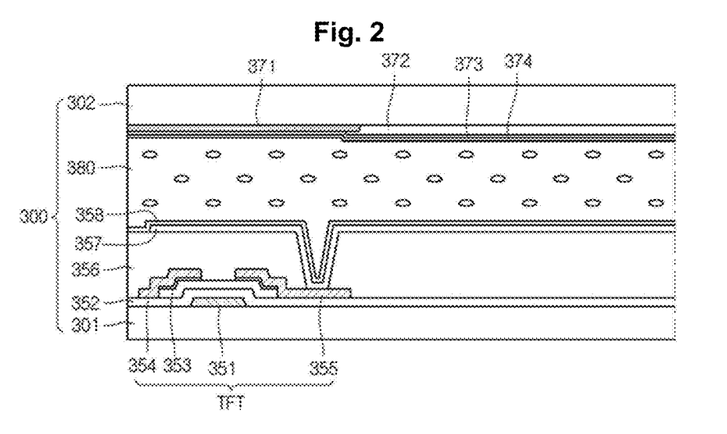
FIGS. 2 and 3 cross-sectional views showing examples of a display panel of the display device according to an embodiment of the present invention.
Figure 3:
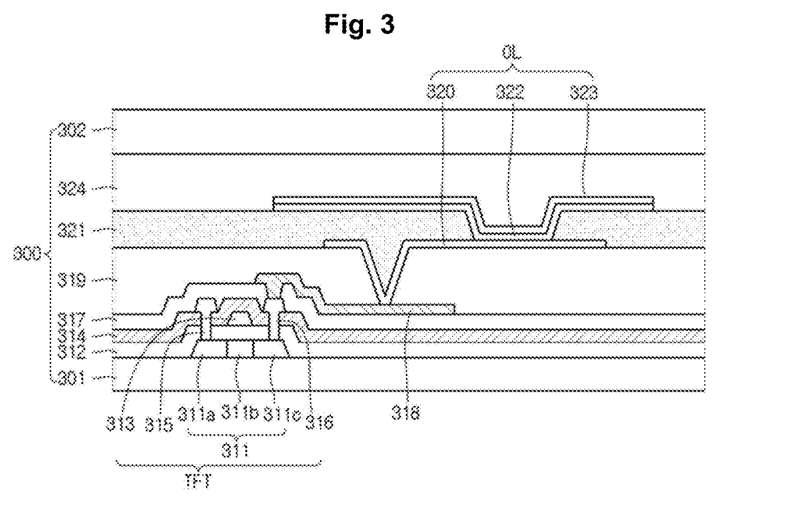
Figure 4:
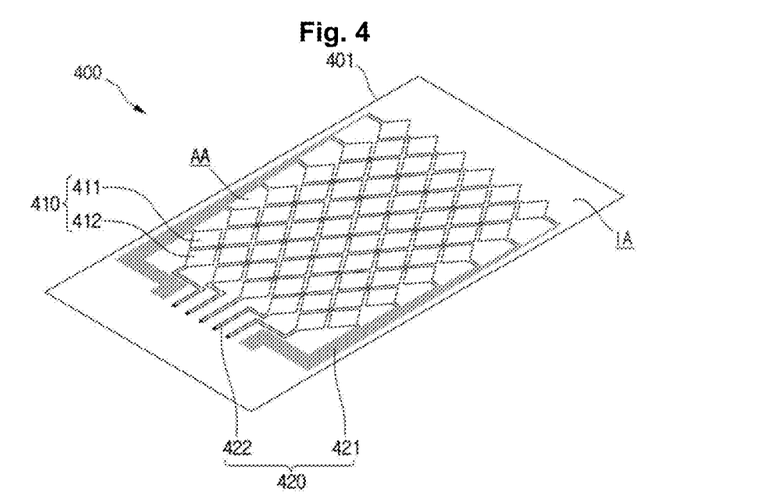
FIGS. 4 and 5 are diagrams showing examples of a touch panel of the display device according to an embodiment of the present invention.
Figure 5:
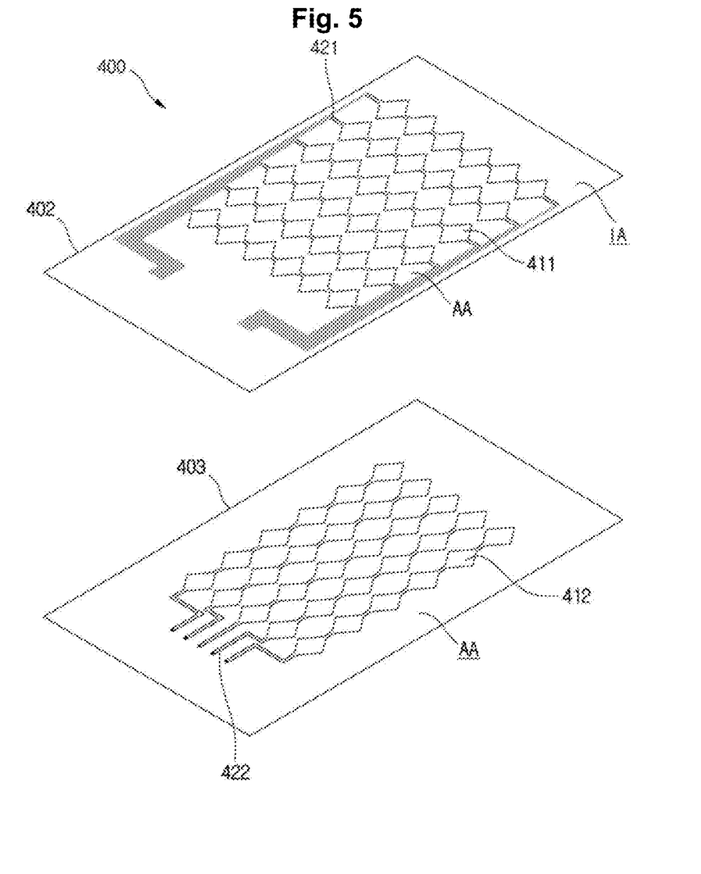

A display device according to an embodiment of the present disclosure will be described in detail with reference to FIGS. 1 through 5. FIG. 1 is a cross-sectional view showing a display device according to an embodiment of the present disclosure. FIGS. 2 and 3 are cross-sectional views showing examples of a display panel of the display device according to an embodiment of the present disclosure. FIGS. 4 and 5 are diagrams showing examples of a touch panel of the display device according to an embodiment of the present disclosure.

Referring to FIG. 1, the display device 100 according to an embodiment of the present disclosure can include a display panel 300 and a cover substrate 200. The cover substrate 200 can be disposed on the display panel 300. Also, the display device 100 according to an embodiment of the present disclosure can include a touch panel 400.

First, the cover substrate 200 will be described in detail.

The cover substrate 200 can be disposed on the most upper layer of the display device 100 and used to protect the display device 100. In detail, the cover substrate 200 can protect the display panel 300 or the touch panel which is disposed under the cover substrate 200. Also, the cover substrate 200 can be formed in a thickness range of about 700 μm~1000 μm.

Such a cover substrate 200 can be formed to contain polymethylmethaacrylate PMMA and a carbonate compound. The carbonate compound can be a compound represented by the following chemical formula 1.

[Chemical formula 1]

In the chemical formula 1, '$R_1$' through '$R_4$' each become one of hydrogen and an alkyl having the number of carbon atoms corresponding to 1~10. Preferably, '$R_2$' through '$R_4$' can become hydrogen. More preferably, '$R_1$' through '$R_4$' can become hydrogen.

On the other hand, the present disclosure allows the carbonate compound to be contained into the cover substrate 200 by about 5 wt %~30 wt %. If below 5 wt % of the carbonate compound is contained into the cover substrate 200, the dielectric constant, the hardness and the flexibility of the cover substrate can 200 can become lower. When above 30 wt % of the carbonate compound is contained into the cover substrate 200, the mechanical property of the cover substrate 200 can vary and the stability of the cover substrate 200 can deteriorate.

Such a cover substrate 200 of the present disclosure has superior surface hardness compared to the related art cover substrate formed from a well known plastic material. For example, the cover substrate 200 can have a pencil hardness of at least 8H. Preferably, the surface hardness (or pencil hardness) of the cover substrate 200 is in a range of 8H~12H. It is more preferable for the cover substrate to become a surface hardness (or a pencil hardness) range of 9H~12H. As such, the display device with the cover substrate 200 of the present disclosure can have a superior scratch-resistance characteristic and a superior abrasion resistance characteristic.

Also, the cover substrate 200 can have superior durability for high temperature and moisture circumstances. For example, the cover substrate 200 can have an expansion rate below 0.1% at a measurement after it is placed under conditions of a temperature of about 70° C. and a relative humidity of about 90% during 96 hours. Preferably, the expansion rate of the cover substrate 200 can be below 1.05%. It is more preferable for the cover substrate 200 to become below 0.02%.

Moreover, the cover substrate 200 has superior flexibility. As such, the cover substrate 200 can be modified into a variety of shapes as such a bent shape, a folded shape and a rolled shape. In accordance therewith, the cover substrate 200 can be applied to a flexible display device. For example, the cover substrate 200 can have a bending curvature below 45 mH. Preferably, the cover substrate 200 has a bending curvature below 40 mm. More preferably, the bending curvature of the cover substrate 200 is in a range of about 20 mm~40 mm. The bending curvature of the cover substrate 200 can be obtained by attaching the cover substrate 200 onto the outer surface of a half-circular drum with a variable curvature radius (or a variety of curvature radiuses), decreasing the curvature radius of the half-circular drum and measuring the radius of the half-circular drum just before the cover substrate 200 is damaged.

Furthermore, the cover substrate 200 can have a high dielectric constant. For example, the cover substrate 200 can have a dielectric constant of at least 4.0. Preferably, the cover substrate 200 can have a dielectric constant range of about 4.0~8.0.

If the touch panel 400 is an electrostatic capacitor type, the touch performance of the touch panel 400 can be affected by the dielectric constant of its formation material. Particularly, the dielectric constant of the cover substrate can become a critical factor affecting the touch performance of the touch panel 200. This results from the fact that the cover substrate 200 is formed in the thickest thickness compared to the other substrates of the display device and disposed in the most upper layer which is exposed to input devices such as a finger, a stylus pen and so on. In view of this point, the display device 100 according to the present disclosure can include the cover substrate with an enhanced dielectric constant in order to enhance touch sensitivity and touch performance.

Second, the display device 300 will now be described in detail.

The display panel 300 can be any one of an LCD panel and an OLED panel. The LCD panel used as the display panel 300 will now be explained with reference to FIG. 2.

Referring to FIG. 2, an LCD panel is used as the display panel 300. The LCD panel 300 is fabricated by combining a first substrate 301 and a second substrate 302 with a liquid crystal layer 380 interposed between the two substrates 301 and 302. A backlight unit (not shown) can be disposed under the LCD panel 300. Although it is not shown in the drawing, at least one polarizer for selectively transmitting light with a fixed polarization property can be attached on at least one of outer surfaces of the first and second substrate 301 and 302.

The LCD panel 300 can be defined into a display area and a non-display area. Gate lines and data lines with having a gate insulation film 352 therebetween are formed on one surface of the first substrate 301 corresponding to the display area. The gate lines and the data lines cross perpendicularly to each other and define pixel regions. Each of the pixel regions includes a thin film transistor TFT. The thin film transistor TFT is connected to a pixel electrode 357 within the respective pixel region through a contact hole which is formed in a passivation layer 356. The first substrate 301 with the above-mentioned structure can be used as a thin film transistor substrate or an array substrate.

The thin film transistor TFT includes a gate electrode 351, the gate insulation film 352, a semiconductor layer 353, a source electrode 354 and a drain electrode 355. As shown in the drawing, the thin film transistor TFT is formed in a bottom gate structure which allows the gate electrode 351 to be disposed under the semiconductor layer 353. Alternatively, the thin film transistor TFT can be formed in a top gate structure which enables the gate electrode 351 to be disposed above the semiconductor layer 353. In other words, structure and so on of the thin film transistor TFT can be variously changed and modified without departing from the technical spirit of the present disclosure.

A black matrix 371 with a lattice shape is formed on one surface of the second substrate 302 of the LCD panel 300. The black matrix 371 screens the non-display area including the thin film transistors and so on of the first substrate 301 and surrounds each of the pixel regions. Also, a color filter layer 372 is formed in the pixel regions which are defined by the lattice of the black matrix 371. The color filter layer 372 includes red, green and blue color filters which are arranged alternately with one another in the pixel regions. Moreover, a common electrode 373 is formed in such a manner as to cover the black matrix 371 and the color filter layer 372.

A first alignment film 358 is interposed between the liquid crystal layer 380 and the pixel electrode 357. Also, a second alignment film 374 is interposed between the liquid crystal layer 380 and the common electrode 373. The first and second alignment films 358 and 374 can be used to set an initial alignment state of liquid crystal molecules and uniformly align the liquid crystal molecules in an alignment direction.

Although it is shown in the drawing that the LCD panel according to the present disclosure has a simplified configuration, it is not limited to this. For example, each of the pixel regions includes only a single thin film transistor. However, at least two thin film transistors can be included into each of the pixel regions according to the driving characteristic of the LCD panel.

The alignment of the liquid crystal molecules can be controlled by a variety of alignment control methods. Actually, a twisted nematic (TN) mode, a vertical alignment (VA) mode, an in-plane switching (IPS) mode, a fringe field switching (FFS) mode and so on can be used to control the alignment of the liquid crystal molecules. As such, although the pixel electrode 357 formed on the first substrate 301 and the common electrode 373 formed on the second substrate 302 are shown in the drawing, the configuration of the pixel electrode 357 and the common electrode 373 can be modified and altered. In the LCD panel of the IPS (In-Plane Switching) mode or the FFS (Fringe Field Switching) mode, the pixel electrode 357 and the common electrode 373 can be formed on the first substrate 301.

Also, the LCD panel 300 can be manufactured in a COT (color filter on transistor) structure. The LCD panel 300 of the COT structure can be prepared by forming thin film transistors, color filter layer and black matrix on the first substrate 301 and combining the first substrate 301 and a second substrate 302 with having a liquid crystal layer therebetween. In detail, the thin film transistors can be formed on the first substrate 301, a passivation can be formed on the entire surface of the first substrate 301 provided with the thin film transistors, and the color filter layer can be formed on the passivation layer. Also, pixel electrodes contacting the respective thin film transistors are formed on the first substrate 301. However, the black matrix can be omitted in order to enhance an aperture ratio of the pixel and simplify mask procedures. In this case, the common electrode can be formed on the first substrate 302 in such a manner as to also serve as the black matrix.

In other words, the LCD panel 300 is not limited to the configuration illustrated in the drawing. As such, configurations of thin film transistor and so on can be variously modified and altered.

Subsequently, an OLED panel used as the display panel will be explained with reference to FIG. 3.

Referring to FIG. 3, the display panel 300 can become an OLED panel. The OLED panel 300 includes a first substrate 301, in which thin film transistors TFT and organic light-emitting elements OL electrically connected to the respective thin film transistors TFT are formed, and a second substrate 302 used to protect the organic light-emitting elements OL. The OLED panel 300 can further include a sealing layer 324 formed between the first substrate 301 and the second substrate 302. Although the sealing layer 324 shown in the drawing is formed in a single layer structure, the sealing layer 324 can be formed a multi-layered structure including a protective layer, an adhesive layer and so on.

The OLED panel 300 can be defined into a display area and a non-display area. The thin film transistors TFTs are formed on one surface of the first substrate 301 corresponding to the display area of the OLED panel 300. Each of the thin film transistors TFTs is formed to include a semiconductor layer 311, a gate electrode 313, a source electrode 315 and a drain electrode 316.

In detail, the semiconductor layer 311 including a source domain 311a, a channel domain 311b and a drain domain 311c is formed on the first substrate 301. A gate insulation film 312 is formed on the entire surface of the first substrate 301 provided with the semiconductor layer 311. A gate line and gate electrode 313 branched from the gate line are formed on the gate insulation film 312. An interlayer insulation film 314 is formed on the gate insulation film 312 provided with the gate line and the gate electrode 313.

Also, a data line, the source electrode 315 branched from the data line and the drain electrode 316 separated from the source electrode 315 by a fixed distance are formed on the interlayer insulation film 314. The data line crosses the gate line with having the interlayer insulation film 314 therebetween, and defines pixel regions. The source electrode 315 and the drain electrode 316 come in contact with the source domain 311a and the drain domain 311c of the semiconductor layer 311 via respective first contact holes which are formed to sequentially penetrate through the interlayer insulation film 314 covering the gate electrode 313 and the gate insulation film 312.

A passivation layer 317 is formed on the entire surface of the first substrate 301 provided with the source and drain electrodes 315 and 316, and a second contact hole exposing the drain electrode 316 is formed in the passivation layer 317. The exposed drain electrode 316 is electrically connected to a connection electrode 318 which is formed on the passivation layer 317. A planarization film 319 is formed on the entire surface of the first substrate 301 provided with the thin film transistor TFT, and a third contact hole exposing the connection electrode 318 is formed in the planarization film 319.

The organic light-emitting element OL electrically connected to the thin film transistor TFT via the third contact hole formed in the planarization film 319 is formed on the first substrate 301. The organic light-emitting element OL includes a lower electrode 320, an organic emission layer 322 and an upper electrode 323.

More specifically, the lower electrode 320 electrically connected to the connection electrode 318 is formed on the planarization film 319. Although it is shown in the drawing that the lower electrode 320 of the organic light-emitting element OL is electrically connected to the drain electrode 315 of the thin film transistor TFT via the connection electrode 318, the connection electrode 318 can be removed from the OLED panel 300. In this case, the lower electrode of the organic light-emitting element OL can be formed on the planarization film 319 in such a manner as to directly contact the drain electrode 315 of the thin film transistor TFT via a contact hole which is formed in the planarization film 319. As such, the passivation layer 317 can also be removed from the OLED panel 300.

A bank pattern 321 exposing the lower electrode 320 by a pixel region size is formed on the planarization film 319 provided with the lower electrode 320. The organic emission layer 322 is formed on the exposed lower electrode 320. The organic emission layer 322 can be configured with a single layer formed from an emission material. Alternatively, the organic emission layer can formed in a multi-layer structure with a hole injection layer, a hole transport layer, an emission material layer, an electron transport layer and an electron injection layer.

The upper electrode 323 is formed on the organic emission layer 322. If the lower electrode 320 is used as an anode electrode, the upper electrode 323 should be used as a cathode electrode. On contrary, the upper electrode 323 should be used as an anode electrode when the lower electrode 320 is used as a cathode electrode.

A sealing member is formed on the first substrate 301 provided with the thin film transistors TFTs and the organic light-emitting elements OLs. For example, the sealing member can be configured with the sealing layer 324 and the second substrate 302. In this case, the sealing layer 324 used to protect the display elements (i.e., the organic light-emitting elements OL) is formed on the entire surface of the first substrate 301 provided with the upper electrode 323. The sealing layer 324 can be formed in a multi-layer structure. The second substrate 302 can be combined with the sealing layer 324. The second substrate 302 can be a sealing substrate used to encapsulation of the first substrate 301. However, the sealing member disposed on the first substrate 301 is not limited to the combination of the sealing layer 324 and the second substrate 302. In other words, a variety of different sealing members well-known to the public can be used to prevent the intrusion of oxygen, moisture and so on, instead of the sealing layer 324 and the second substrate 302.

Such configurations of the display devices according to the present disclosure are not limited to those shown in the drawings. In other words, the examples of the display device according to the first embodiment of the present disclosure can be variously modified and altered.

Third, the touch panel 400 will now be described in detail.

The touch panel 400 can be an add-on type touch panel 400. Alternatively, the touch panel 400 can be an integrated type touch panel 400.

If the touch panel 400 is the add-on type touch panel 400, the touch panel 400 is prepared in such a manner as to be separate from the display panel 300. As such, a transparent adhesive layer (not shown) can be formed between the touch panel 400 and the display panel 300.

In this case, the touch panel 400 can be prepared in such a manner as to be separated from the cover substrate 200 or united with the cover substrate 200. If the touch panel 400 and the cover substrate 200 are separated from each other, another transparent adhesive layer (not shown) can be formed between the cover substrate 200 and the touch panel 400. On contrary, when the touch panel 400 is united with the cover substrate 200 in a single body, sensing electrodes and so on can be formed on the rear surface of the cover substrate 200. As such, it is not necessary to form an additional adhesive layer between the cover substrate 200 and the touch panel 400.

When the touch panel 400 is the integrated type touch panel 400, the touch panel 400 can be formed in a single body united with the display panel 300. As such, it is not necessary to interpose any adhesive layer between the display panel 300 and the touch panel 400. Also, the touch panel 400 can be formed in one of an on-cell type and an in-cell type.

If the touch panel 400 is the on-cell type, sensing electrodes and so on can be formed on the upper surface of the display panel 300. In detail, the sensing electrodes and so on can be formed directly on an upper substrate of the display panel 300. Also, the touch panel 400 can be formed in such a manner as to be separate from the cover substrate 200, like the add-on type touch panel 400. Alternatively, the on-cell type touch panel 400 can be formed in a single body united with the cover substrate 200.

When the touch panel 400 is the in-cell type, sensing electrodes and so on can be formed between the first and second substrates of the display panel 300. In other words, the sensing electrodes and so on can be formed when display elements are formed in the display panel 300. As such, the cover substrate 200 must be prepared in such a manner as to be separate from the touch panel 400. In accordance therewith, a transparent adhesive layer can be formed between the cover substrate 200 and the display panel 300.

The touch panel 400 will be described in detail with reference to FIGS. 4 and 5. FIGS. 4 and 5 show examples of an add-on type touch panel which is separate from the cover substrate 200. However, the touch panel 400 of the present disclosure is not limited to configurations shown in the drawings. In other words, the touch panels shown in the drawings can be applied to the above-mentioned add-on and integrated types.

Referring to FIGS. 4 and 5, touch panels 400 can be each defined into a display area AA transmitting light and a non-display area IA intercepting light. The display area AA is used to input a command through a touch of a user. Unlike the display area AA, the non-display area IA cannot be used in the input of commands because it is not activated in spite of a touch of a user.

As shown in FIG. 4, the touch panel 400 can include sensing electrodes 410 and scan lines 420 which are arranged on one surface of a touch substrate 401. The touch substrate 401 can include one of tempered glass, heat strengthened glass, soda-lime glass, reinforced plastic and flexible plastic, but it is not limited to this.

The sensing electrodes 410 are arranged on the display area AA, and the scan lines 420 are arranged on the non-display area IA. Although it is not shown in the drawing, a printed layer is additionally formed in the non-display area IA of the touch substrate 401. In this case, the scan lines 420 can be formed on the printed layer.

The sensing electrodes 410 can include a conductive material. For example, the sensing electrodes 410 can include any one selected from a material group which consists of a transparent conductive material, a metal, nano-wire, a sensitive nano-wire film, carbon nanotube, grapheme, conductive polymer and mixture thereof.

The sensing electrodes 410 can include first sensing electrodes 411 and second sensing electrodes 412. The first sensing electrodes 411 and the second sensing electrodes 412 can include the same material or different materials from each other. Also, the first sensing electrodes 411 and the second sensing electrodes 412 can be arranged on the same surface of the touch substrate 401.

In case the first sensing electrodes 411 and the second sensing electrodes 412 are arranged on the same surface of the touch substrate 401, the first sensing electrodes 411 and the second sensing electrodes 412 must be formed without contacting each other. To this end, an insulation layer and bridge electrodes can be formed on the display area AA.

In detail, one side of the first sensing electrodes 411 and the second sensing electrodes 412 arranged under the insulation layer can be formed in such as a manner as to be electrically connected to one another. The other side can be formed with being connected to the bridge electrodes formed on the insulation layer, and electrically connected to one another. As such, the first sensing electrodes electrically connected to one another can be isolated from the second sensing electrodes 412 by the insulation layer and the bridge electrodes. Also, the first sensing electrodes 411 can be electrically connected to one another by the bridge electrodes.

The first and second sensing electrodes 411 and 412 arranged on the display area AA can be used to sense a touch. To this end, the first sensing electrodes 411 can be connected to one another in one direction (for example, a horizontal direction), and the second sensing electrodes 412 can be connected to one another in a different direction (for example, a vertical direction).

The scan lines 420 can include first scan lines 421 and second scan lines 422. In detail, the scan lines 420 can include the first scan lines 421 connected to the first sensing electrodes 411, and the second scan lines 422 connected to the second sensing electrodes 412.

The first scan lines 421 and the second scan lines 422 can be connected to a printed circuit board (not shown). In other words, the first scan lines 421 and the second scan lines 422 transfer touch signals sensed by the first sensing electrodes 411 and the second sensing electrodes 412 to the printed circuit board (not shown) which is loaded with a driver chip (not shown), and allows a touch detecting operation to be performed. The printed circuit board (not shown) can be a flexible printed circuit board (FPCB) as an example.

The first scan lines 421 and the second scan lines 422 can include a conductive material. For example, the first scan lines 421 and the second scan lines 422 can include a metal material such as silver Ag, copper Cu or others.

Although it is not shown in the drawing, a passivation layer can further be formed on the touch substrate 401 provided with the scan lines 420. The passivation layer can protect the scan lines 420. In detail, the passivation layer can prevent the scan lines 420 from being exposed to and oxidized by oxygen. Also, the passivation layer can prevent reliability deterioration due to moisture intrusion.

Referring to FIG. 5, the touch panel 400 can include a first touch substrate 402 and a second touch substrate 403. The first touch substrate 402 and the second touch substrate 403 can each include one of tempered glass, heat strengthened glass, soda-lime glass, reinforced plastic and flexible plastic, but they are not limited to this. Also, the first touch substrate 402 and the second touch substrate 403 can be combined with each other using a transparent adhesive such as an OCA (optically clear adhesive) or others.

First sensing electrodes 411 can be arranged in the display area AA of the first touch substrate 402. Also, first scan lines 421 can be arranged in the non-display area IA of the first touch substrate 402. The first scan lines 421 are connected to the respective first sensing electrodes 411.

On the other hand, second sensing electrodes 412 can be arranged in the display area AA of the second touch substrate 403. Also, second scan lines 422 can be arranged in the non-display area IA of the second touch substrate 403. The second scan lines 422 are connected to the respective second sensing electrodes 412. The first scan lines 421 and the second scan lines 422 can be electrically connected to a printed circuit board (not shown).

However, the touch panel 400 of the present disclosure is not limited to the drawings and the description provided above. In other words, any input device capable of inputting commands by touching a finger, a stylus pen or others on a front surface of a display device can be used as the touch panel 400 of the present disclosure. Actually, any touch panel being generally used by the public can be applied as the touch panel 400 of the present disclosure.

The cover substrate in accordance with the present disclosure will now be described in more detail through examples. These examples are provided as illustrations, but they do not limit the present disclosure. In other words, these examples might be embodied in a different shape. Therefore, the scope of the present disclosure must be not limited to these examples described here.

Example 1

A cover substrate of example 1 is manufactured from a resin composition which is obtained by mixing a 90 wt % of polymethylmethacrylate (PMMA) and a 10 wt % of ethylene carbonate (EC). Also, the cover substrate of the example 1 is formed in a thickness of about 0.8 mm.

Example 2

A cover substrate of example 2 is manufactured from a resin composition which is obtained by mixing an 85 wt % of polymethylmethacrylate (PMMA) and a 15 wt % of ethylene carbonate (EC). Also, the cover substrate of example 2 is formed in a thickness of about 0.8 mm.

Example 3

A cover substrate of example 3 is manufactured from a resin composition which is obtained by mixing an 80 wt % of polymethylmethacrylate (PMMA) and a 20 wt % of ethylene carbonate (EC). Also, the cover substrate of the example 3 is formed in a thickness of about 0.8 mm.

Comparative Example 1

A cover substrate of comparative example 1 is manufactured from a polymethylmethacrylate (PMMA) resin. Also, the cover substrate of comparative example 1 is formed in a thickness of about 0.8 mm.

Comparative Example 2

A cover substrate of comparative example 2 is manufactured from a copolymer resin of polymethylmethacrylate and styrene. In other words, the cover substrate of comparative example 2 is manufactured from a copolymer resin which contains a 60 wt of polymethylmethacrylate and a 40 wt % of styrene. Also, the cover substrate of comparative example 2 is formed in a thickness of about 0.8 mm.

Comparative Example 3

A cover substrate of comparative example 3 is manufactured in a double-layered structure of a polymethylmethacrylate layer and a polycarbonate layer by co-extruding a polymethylmethacrylate resin and a polycarbonate resin. The polymethylmethacrylate layer is formed in a thickness of about 0.7 mm and the polycarbonate layer is formed in a thickness of about 0.1 mm.

Comparative Example 4

A cover substrate of comparative example 4 is manufactured from a resin composition which is obtained by mixing a 90 wt % of polymethylmethacrylate (PMMA) and a 10 wt % of rubber (a product name of 'cis-1220'). The cover substrate of comparative example 4 is formed in a thickness of 0.8 mm.

Comparative Example 5

A cover substrate of comparative example 5 is manufactured from a resin composition which is obtained by mixing a 90 wt % of polymethylmethacrylate (PMMA) and a 15 wt % of rubber (a product name of 'cis-1220'). The cover substrate of comparative example 5 is formed in a thickness of 0.8 mm.

Comparative Example 6

A cover substrate of comparative example 6 is manufactured from a resin composition which is obtained by mixing a 90 wt % of polymethylmethacrylate (PMMA) and a 10 wt % of zirconia $ZrO_2$. The cover substrate of comparative example 6 is formed in a thickness of 0.8 mm.

Comparative Example 7

A cover substrate of comparative example 7 is manufactured in a double-layered structure of a polymethylmethacrylate layer and an AZO (aluminum-doped zinc oxide) coating layer. The polymethylmethacrylate layer is formed from a 100 wt % of polymethylmethacrylate and in a thickness of about 0.8 mm. The AZO coating layer is formed in a thickness of about 0.5 μm.

[Experiments]

In order to measure transmittances, hazes, dielectric constants, surface hardnesses, heat distortion temperatures, expansion rates under high temperature and humidity circumstances, bending properties, durabilities for the cover substrates of above examples 1 to 3 according to embodiments of the present invention and comparative examples 1 to 7, the following measurements are performed for the cover substrates of examples 1 to 3 and comparative examples 1 to 7. The measured resultants obtained through the following measurements are represented in table 1.

(1) Transmittance and Haze

Quantities of total transmission light, diffuse light and collimated light in a cover substrate sample with a size of 10 mm×10 mm are measured using a digital hazemeter which is manufactured by 'Tokyo Denshoku' and has a model number of 'TC-HIIIDPK/III'. Thereafter, the transmittance and the haze are obtained on the basis of the quantities of total transmission light, diffuse light and collimated light.

(2) Dielectric Constant

The dielectric constant of a cover substrate sample is measured using a precision impedance analyzer, which is manufactured by Hitachi Ltd. in a model number of E4980A, in a state that the cover substrate sample receiving a DC voltage of 3V is sequentially exposed to radio signals of 1 KHz~1 MHz. In this case, the cover substrate sample is defined into a size range of 100 $mm^2$~900 $mm^2$. Also, platinum coating film with a thickness range of about 20 nm~100 nm are coated on the upper and lower surfaces of the cover substrate sample. The dielectric constant of the cover substrate sample can be calculated on the basis of a charge quantity which is measured through probes contacting the platinum coating films and transferring the DC voltage.

(3) Surface Hardness

The end of a pencil is planarized by a sand paper of 400 cw. The surface hardness can be measured by inclining the pencil at an angle of 45° and drawing the pencil across a cover substrate sample. If a scratch is generated on the surface of the cover substrate sample, the surface hardness of the cover substrate sample is determined as a lower hardness value than that of the used pencil by one degree.

(4) Heat Distortion Temperature

The heat distortion temperature of a cover substrate sample can be measured in a three point bending mode using a dynamic mechanical analysis under a temperature raising condition of 5° C./min and a load of 10 g.

(5) Expansion Rate Under High Temperature and Humidity

The expansion rate can be obtained on the basis of a length of a cover substrate sample measured after the cover substrate sample is placed under a temperature of 70° C. and a humidity of 90% during 96 hours. In detail, the expansion rate is calculated by the following equation.

Expansion rate (%)={(the length of the cover substrate sample after placing−the length of the cover substrate sample before placing)/the length of the cover substrate sample before placing}×100

(6) Flexibility (i.e., Bending Curvature)

A cover substrate sample is defined into a size of 100 m×30 mm. The bending curvature of the cover substrate sample can be obtained by attaching the cover substrate sample onto the outer surface of a half-circular drum with a variable curvature radius (or a variety of curvature radiuses), decreasing the curvature radius of the half-circular drum and measuring the radius of the half-circular drum just before the cover substrate sample is damaged.

(7) Durability

The durability of a cover substrate sample can be obtained by dropping a SUS (steel use stainless) ball of 22 g and measuring a height of the SUS ball when the cover substrate sample is damaged.

Moreover, the cover substrates of examples 1 to 3 have low size variation coefficients (or low expansion rates) of about 0.01% under high temperature and humidity circumstances as described in table 1. On the contrary, the cover substrates of comparative examples 1, 2 and 4 to 7 have higher size variation coefficients (or higher expansion rates) compared to those of examples 1 to 3.

Furthermore, the cover substrates of examples 1 to 3 have bending curvatures below 45 mm as described in table 1. In other words, the cover substrates of examples 1 to 3 have superior flexibility (or moldability). On the other hand, the cover substrate of comparative example 6 having low bending curvature cannot be used as a flexible substrate.

TABLE 1

| | Transmittance (%) | Dielectric constant (∈) | Surface hardness | Heat distortion temperature (□) | Expansion rate under high temperature and humidity (%) | Flexibility (mm) | Durability (cm) | Haze |
|---|---|---|---|---|---|---|---|---|
| Example 1 | 92 | 4.2 | 9 H | 105 | 0.01 | 45 | 20 | Below 1.0 |
| Example 2 | 92 | 4.5 | 9 H | 95 | 0.01 | 40 | 25 | Below 1.0 |
| Example 3 | 92 | 4.8 | 9 H | 75 | 0.01 | 40 | 25 | Below 1.0 |
| Com. Example 1 | 92 | 3.0 | 9 H | 107 | 0.08 | 45 | 20 | Below 1.0 |
| Com. Example 2 | 92 | 3.0 | 3 H | 90 | 0.40 | 40 | 20 | Below 1.0 |
| Com. Example 3 | 91 | 2.9 | 4 H | 107 | 0.01 | 45 | 25 | Below 1.0 |
| Com. Example 4 | 91 | 2.8 | 7 H | 95 | 0.12 | 45 | 25 | Below 1.0 |
| Com. Example 5 | 91 | 2.8 | 7 H | 87 | 0.12 | 45 | 25 | Below 1.0 |
| Com. Example 6 | 87 | 4.2 | 9 H | 110 | 0.04 | 50 | 20 | 3.4 |
| Com. Example 7 | 92 | 3.0 | 3 H | 107 | 0.08 | 45 | 15 | Below 1.0 |

As seen from table 1, it is evident that the cover substrates of examples 1 to 3 and comparative examples 1 to 5 and 7 have transmittances above 90% and hazes below 1.0. As such, the cover substrates of examples 1 to 3 and comparative examples 1 to 5 and 7 are transparent. On the contrary, the cover substrate comparative example 6 having a transmittance below 90% and a high haze of 3.4 cannot be applied to any display device.

Referring to table 1, it is clear that the cover substrates of examples 1 to 3 have high dielectric constants above 4.0. As such, the cover substrates of examples 1 to 3 having the high dielectric constants are profitable for implementation of touch sensitivity and performance compared to those of comparative examples 1 to 4 and 7.

It is evident that the cover substrates of example 1 to 3 have a high surface hardness of about 9H as described in table 1. On the other hand, the cover substrates of comparative examples 2 to 5 and 7 cannot be applied to any display device because of their low surface hardness.

Also, the heat distortion temperatures of the cover substrates of examples 1 to 3 are higher than 70° C. as described in table 1. In general, a print drying process is performed under temperatures of about 70° C. In order to secure stability in the print drying process, the cover substrate 200 must be formed to have a heat distortion temperature above 70° C. In view of this point, the cover substrates of examples 1 to 3 each having the heat distortion temperature above 70° C. can be used as the cover substrate 200.

The above-mentioned features, structures, effects and so on of the present disclosure are included in at least one example. without being limited to only a single embodiment. Moreover, it is apparent to the ordinary skilled person in the art that various variations and modifications are possible to the features, structures, effects and so on which are disclosed by the embodiments. Therefore, it is interpreted that such variations and modifications are included in the scope of the present disclosure.

Also, although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. More particularly, various variations and modifications are possible in the component parts which are described in the embodiments. Accordingly, the scope of the present disclosure shall be determined only by the appended claims and their equivalents without being limited to the detailed description.

What is claimed is:

1. A display device comprising:
   a display panel configured to include a first substrate and a second substrate; and
   a cover substrate disposed on the display panel and configured to contain a resin composition of a mixture of polymethylmethacrylate (PMMA) and a carbonate compound, wherein the carbonate compound is ethylene carbonate,
wherein the carbonate compound is included into the cover substrate in an amount of 5 wt % to 20 wt %,
wherein the PMMA is included into the cover substrate in an amount of 80 wt % to 90 wt %,
wherein the display device further comprises a touch panel interposed between the display panel and the cover substrate and configured to include a touch substrate loaded with sensing electrodes, and
wherein the cover substrate is formed to have a transmittance above 90%, a haze below 1.0, a dielectric constant in a range of 4.0~8.0, and an expansion rate below 0.02% when placed under a condition of a temperature of 70° C. and a relative humidity of about 90% for 96 hours.

2. The display device of claim 1, wherein the cover substrate is formed to have a surface hardness above 8H.

3. The display device of claim 1, wherein the cover substrate is formed to have a bending curvature below 45 mm.

4. The display device of claim 1, wherein the sensing electrodes are formed on a rear surface of the cover substrate.

5. The display device of claim 1, wherein the sensing electrodes are formed on an upper surface of the display panel.

6. The display device of claim 1, further comprising sensing electrodes formed between the first substrate and the second substrate.

7. The display device of claim 1, wherein the display panel is a flexible display panel.

8. The display device of claim 1, wherein the display panel is an organic light emitting display panel.

9. The display device of claim 1, wherein the display panel is a liquid crystal display panel.

10. A display device comprising:
a display panel configured to include a first substrate and a second substrate;
touch sensing electrodes between the first substrate and the second substrate; and
a cover substrate disposed on the display panel and configured to contain a resin composition of a mixture of polymethylmethacrylate (PMMA) and a carbonate compound,
wherein the carbonate compound includes a compound represented by the following chemical formula 1:

[Chemical formula 1]

wherein in the chemical formula 1, the terms '$R_1$' through '$R_4$' each is one of hydrogen and an alkyl having the number of carbon atoms corresponding to 1~10,
wherein the carbonate compound is included into the cover substrate in an amount of 5 wt % to 20 wt %,
wherein the PMMA is included into the cover substrate in an amount of 80 wt % to 90 wt %,
wherein the cover substrate has a transmittance above 90%, and a haze below 1.0, a dielectric constant in a range of 4.0~8.0, and an expansion rate below 0.02% when placed under a condition of a temperature of 70° C. and a relative humidity of about 90% for 96 hours.

11. The display device of claim 10, wherein the terms '$R_2$' through '$R_4$' are hydrogen.

12. The display device of claim 11, wherein the term '$R_1$' is hydrogen.

13. The display device of claim 10, wherein the cover substrate is formed to have a surface hardness above 8H.

14. The display device of claim 10, wherein the cover substrate is formed to have a bending curvature below 45 mm.

15. The display device of claim 10, wherein the display panel is an organic light emitting display panel or a liquid crystal display panel.

* * * * *